(12) United States Patent
Kawata

(10) Patent No.: US 7,563,651 B2
(45) Date of Patent: Jul. 21, 2009

(54) METHOD OF FABRICATING A SUBSTRATE WITH A CONCAVE SURFACE

(75) Inventor: Tsutomu Kawata, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 449 days.

(21) Appl. No.: 11/401,291

(22) Filed: Apr. 11, 2006

(65) Prior Publication Data

US 2006/0226538 A1 Oct. 12, 2006

(30) Foreign Application Priority Data

Apr. 11, 2005 (JP) ............... 2005-113274

(51) Int. Cl.
*H01L 21/00* (2006.01)
*H01L 23/12* (2006.01)
(52) U.S. Cl. .................. 438/125; 257/701; 257/782; 257/E23.003; 257/E23.008; 257/E23.167
(58) Field of Classification Search ............... None
See application file for complete search history.

(56) References Cited

U.S. PATENT DOCUMENTS 5,510,273 A * 4/1996 Quinn .................. 156/160
6,225,699 B1 * 5/2001 Ference et al. ............ 257/777
7,148,081 B2 * 12/2006 Higashino et al. .......... 438/106
7,223,639 B2 * 5/2007 Blaszczak et al. .......... 438/127

FOREIGN PATENT DOCUMENTS

| JP | 10-326800 | | 12/1998 |
| JP | 2000-323624 | | 11/2000 |
| JP | 2004221319 A | * | 8/2004 |
| JP | 2004-311574 | | 11/2004 |

* cited by examiner

*Primary Examiner*—Alonzo Chambliss
(74) *Attorney, Agent, or Firm*—Young & Thompson

(57) ABSTRACT

Bending generated in a side of a device mounting surface of an organic resin substrate after an assembly process for a semiconductor device is inhibited, thereby providing an improved production yield. A semiconductor device 100 is formed by solder-joining a semiconductor chip 105 onto a device mounting surface 111 of an interposer that is composed of an organic resin substrate 101. The interposer is an interposer, which is composed of an organic resin substrate 101, and on one surface of which a semiconductor chip 105 is to be mounted, and has a convex curvature in a side of a back surface 113 opposite to the device mounting surface 111, in a condition before an assembling process for the semiconductor device 100.

5 Claims, 16 Drawing Sheets

131

METHOD OF FABRICATING A SUBSTRATE WITH A CONCAVE SURFACE

This application is based on Japanese patent application No. 2005-113,274, the content of which is incorporated hereinto by reference.

BACKGROUND

1. Technical Field

The present invention relates to an interposer and a semiconductor device employing thereof, and also relates to a method for manufacturing a semiconductor device.

2. Related Art

Conventional technologies for flip-bonding a semiconductor chip onto a substrate (interposer) includes technologies described in Japanese Patent Laid-Open No. 2000-323,624, Japanese Patent Laid-Open No. H10-326,800 (1998) and Japanese Patent Laid-Open No. 2004-311,574.

Japanese Patent Laid-Open No. 2000-323,624 describes a bending of an insulating substrate, which is occurred when an underfill resin disposed between a semiconductor chip and the insulating substrate is cured, in a process for manufacturing a ball grid array (BGA) package. In addition, an attempt of reducing the level of the bending by suitably adjusting a injecting quantity of the underfill resin is also described in Japanese Patent Laid-Open No. 2000-323,624.

Japanese Patent Laid-Open No. H10-326,800 describes a technology for preventing a bending of a package by providing an encapsulation with a resin in a metal mold including a concave geometry, after a semiconductor device is mounted on a substrate.

Japanese Patent Laid-Open No. 2004-311,574 describes a technology for inhibiting a bending of a semiconductor chip or an interconnect substrate by having a varied thickness of an interposer composed of silicon along a width-direction.

SUMMARY OF THE INVENTION

However, the present inventors have further investigated these technologies, and have found that smaller thickness of the interposer than the interposer made of silicon employed in Japanese Patent Laid-Open No. 2004-311,574 is often employed, in particular, when a semiconductor package is assembled employing an interposer including a substrate made of an organic resin. In addition, such interposer is made of a material having poor stiffness, as compared with silicon. Consequently, sufficient stiffness of such interposer for withstanding a bending generated by factors such as a difference in thermal expansion coefficient between the semiconductor chip and the interposer, a shrinkage occurred in a cure of a liquid resin and the like, cannot be ensured, and therefore a side of a device mounting surface of the interposer is easily bent to form a convex shape after the completion of the assembly of the semiconductor package. Further, specification in flatness after the assembly (co-planarity) cannot be satisfied, even if the technology described in the above-described in Japanese Patent Laid-Open No. 2000-323,624 is employed, and thus there is a concern that production yield of devices may be reduced.

In addition, since the technology described in Japanese Patent Laid-Open No. H10-326,800 involves conducting a processing for bending the substrate after the semiconductor is mounted on the substrate, there is a concern that the semiconductor may be damaged in such processing.

According to one aspect of the present invention, there is provided a method for manufacturing a semiconductor device, comprising: forming a concave surface on an organic resin substrate by bending the organic resin substrate so as to provide a concave curvature in a side of a device mounting surface of the organic resin substrate; and joining a semiconductor device on the organic resin substrate by disposing the semiconductor device on the concave surface and heating thereof; wherein the concave surface is stretched in the joining the semiconductor device to provide a planarized surface.

In the method for manufacturing the semiconductor device according to the present invention, the concave surface formed in the side of the organic resin substrate is stretched in the operation of joining the semiconductor device to provide a planarized surface. Consequently, since an improved flatness of the organic resin substrate can be presented after the operation of joining the semiconductor device, a production yield can be improved.

According to another aspect of the present invention, there is provided an interposer, which is composed of an organic resin substrate, and on one surface of which a semiconductor device is to be mounted, and which has a convex curvature in a side of the back surface opposite to the device mounting surface.

The interposer according to the present invention is composed of an organic resin substrate, and has a convex curvature in the side of the back surface opposite to the device mounting surface. Consequently, the geometry of the device mounting surface of the interposer according to the present invention before mounting the device is a concave shape. Thus, the convex curvature of the organic resin substrate in the side of the device mounting surface created by the bending when the semiconductor device is joined onto the device mounting surface allows compensating an inverted bending previously occurred in the organic resin substrate, thereby providing the configuration exhibiting an improved flatness of the organic resin substrate after mounting the semiconductor device.

According to further aspect of the present invention, there is provided a semiconductor device, comprising the aforementioned interposer and the semiconductor device, wherein the semiconductor device is solder-joined onto the device mounting surface.

In the semiconductor device according to the present invention, the semiconductor device is solder-joined onto the above-described device mounting surface of the interposer. Consequently, the bending created in the interposer in the solder-joining process allows compensating the inverted curvature previously provided to the interposer, thereby providing the configuration exhibiting an improved flatness and planarization of the organic resin substrate of the interposer. Consequently, higher level of a satisfaction for the requirement in the flatness of the substrate can be achieved, thereby providing the configuration that can exhibit an improved production yield.

It is to be understood that the invention is capable of use in various other combinations, modifications, and environments, and any other exchange of the expression between the method and device or the like according to the present invention may be effective as an alternative of an embodiment according to the present invention.

For example, according to the present invention, a semiconductor device formed by the aforementioned method for manufacturing the semiconductor device may be presented.

Since the interposer composed of an organic resin substrate has a convex curvature in the side of the back surface opposite to the device mounting surface according to the present invention, a curvature created in the organic resin substrate in the side of the device mounting surface after the assembly of the semiconductor device can be decreased, thereby providing an improved production yield of the product.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First of all, for better understanding of the present invention, conventional processes for manufacturing semiconductor devices described in the above description of the summary of the invention and the bending created during the manufacture is described.

Figure 13:
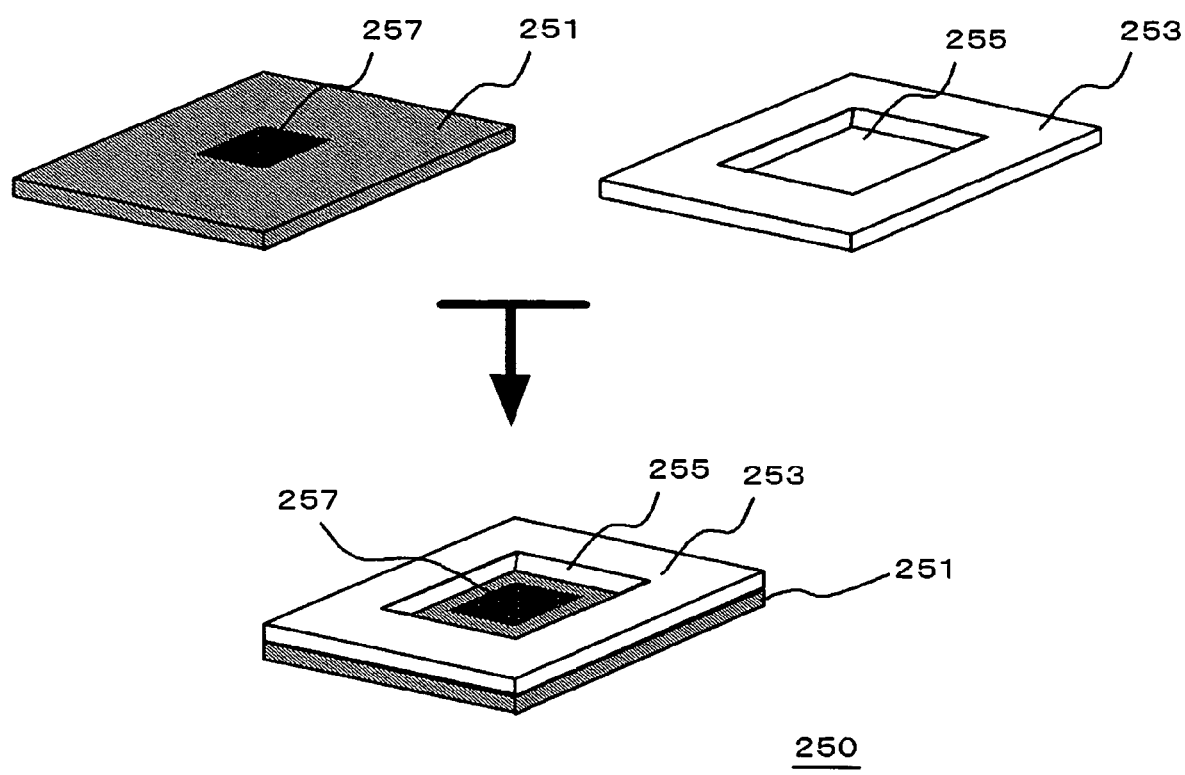
FIG. 13 includes exploded perspective views, useful in describing a configuration and a method for manufacturing the conventional interposer.

FIG. 13 includes perspective views, describing a configuration of a conventional interposer and method for manufacturing thereof. An interposer shown in FIG. 13 is composed of an organic resin substrate 251. Further, a stiffener 253 is stacked on a device mounting surface of the organic resin substrate 251 via a flat pressing process to compose a multiple-layered member 250. An opening 255 is formed at a position in stiffener 253 corresponding to a chip-mounting region 257 of the organic resin substrate 251, and the chip-mounting region 257 is exposed out from the opening 255.

While the organic resin substrate 251 is manufactured so that the interposer itself maintains a certain level of flatness in the configuration shown in FIG. 13, the substrate, in reality, may include a convex curvature in a side of the device mounting surface due to a bending before mounting the semiconductor chip thereon.

FIG. 14A to FIG. 14C and FIG. 15A to FIG. 15C are cross-sectional views, illustrating a process for manufacturing the semiconductor device that employs the interposer shown in FIG. 13.

Figure 14A:
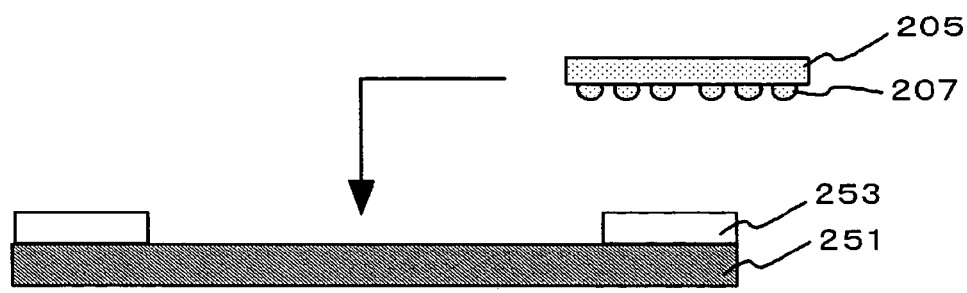
FIGS. 14A to 14C are cross-sectional views, illustrating the process for manufacturing the conventional semiconductor device.
Figure 14B:
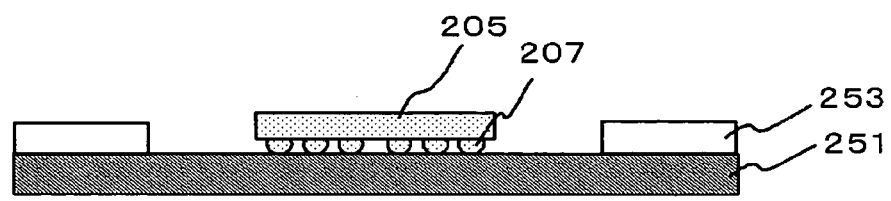
Figure 14C:
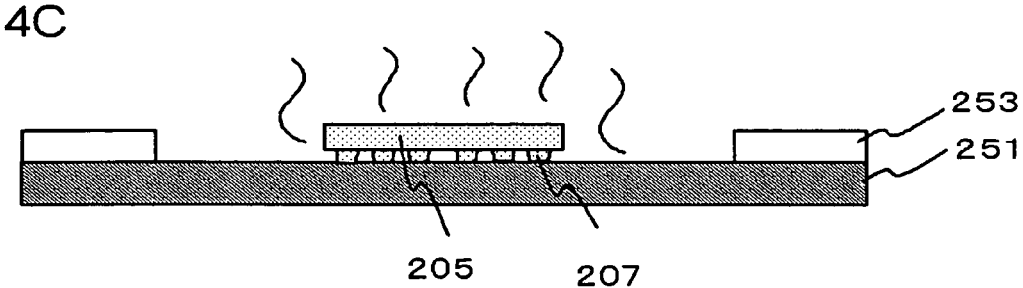
Figure 15A:
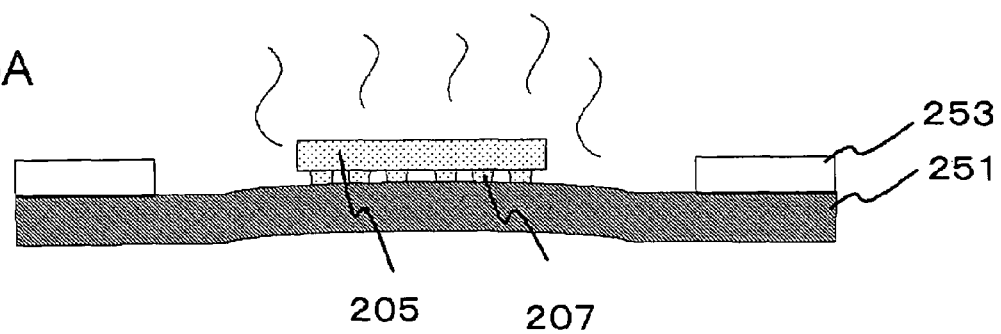
FIGS. 15A to 15C are cross-sectional views, illustrating the process for manufacturing the conventional semiconductor device.
Figure 15B:
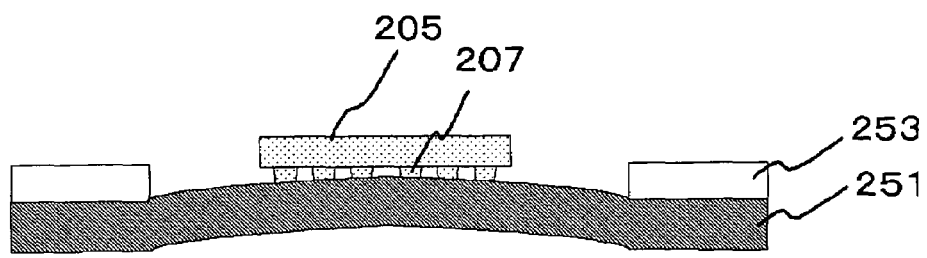

First of all, as shown in FIG. 14A, the multiple-layered member 250 and a semiconductor chip 205 are prepared. The device-forming surface of the semiconductor chip 205 is provided with solder balls 207. Then, the semiconductor chip 205 is disposed on the organic resin substrate 251 (FIG. 14B), and the substrate is heated to cause a reflow of the solder ball 207, solder-joining thereof onto the organic resin substrate 251 (FIG. 14C). In this process for providing the junction, the organic resin substrate 251 is bent to form a convex surface in the side of the device mounting surface (FIG. 15A). Although the factor thereof is not necessarily clear, it is considered that the factor thereof may be a difference in thermal expansion coefficient between the organic resin substrate 251 and the semiconductor chip 205, or a difference in stiffness between the substrate and a solder ball 207.

Figure 15C:
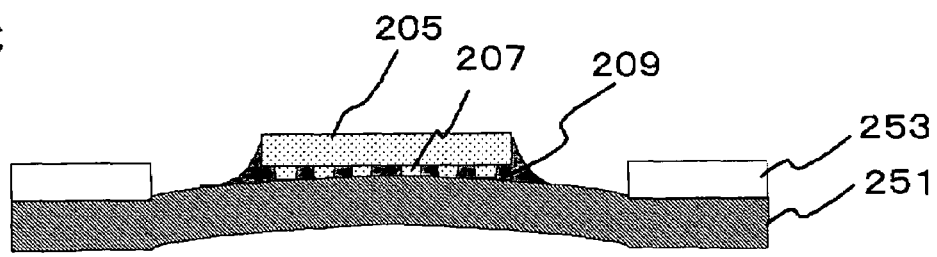

Then, the obtained semiconductor device is cooled down to a room temperature (FIG. 15B), and thereafter, a liquid underfill resin is supplied between the semiconductor chip 205 and the organic resin substrate 251 to fill the spaces formed therebetween, and the underfill resin is heated to be cured, forming underfill layers 209 (FIG. 15C). In the process for forming the underfill layer 209, the organic resin substrate 251 is also bent to form a convex surface in the side of the device mounting surface, due to a shrinkage of the underfill resin occurred in the curing process, or the like. In this way, a semiconductor device 200 shown in FIG. 15C is obtained.

As described above, since the organic resin substrate 251 is composed of a material having higher thermal expansion coefficient and lower elastic modulus, as compared with silicon, in the conventional semiconductor device 200, it is difficult to reduce a generation of bending in the assembly process even if a stiffener 253 is employed for ensuring a flatness of the substrate, and in particular, it is further difficult when the organic resin substrate 251 having a thickness of equal to or less than 1.1 mm is employed, and therefore the bending of the organic resin substrate 251 is eventually remarkable in the stage of a completion of the manufacture of the semiconductor device 200, as shown in FIG. 15C.

Levels of such bending of the substrate are generally larger, and when, for example, the organic resin substrate 251 of 50 mm square is employed, the level of such bending may be equal to or larger than 200 µm, and more considerable case, the level of such bending may be equal to or larger than 250 µm, leading to a situation, in which the substrate cannot satisfy a flatness specification required for semiconductor packages. The flatness specification required in the case of employing the substrate having the above-described dimension is generally, for example, equal to or lower than 200 µm, and preferably equal to or lower than 150 µm. Consequently, it is often experienced that the required flatness specification can not be satisfied, even though a cover member called a lid (heat spreader) is provided on the stiffener 253 after the process shown in FIG. 15C.

Figure 16:
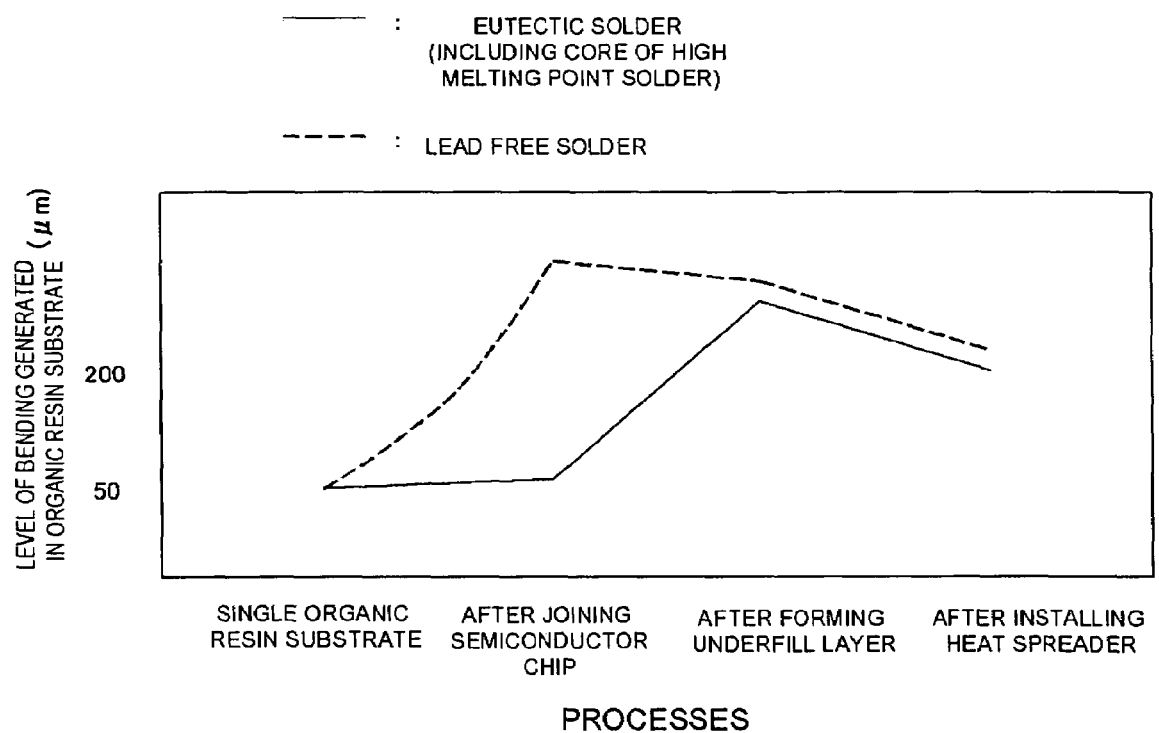
FIG. 16 is a graph, schematically illustrates relationships of the process for manufacturing the semiconductor device with the level of the bending in the substrate.

FIG. 16 is a graph, schematically illustrates relationships between the steps in the process for assembling the semiconductor device 200 and the levels of bending. In FIG. 16, a level of bending is determined to be a height of a highest point of the device mounting surface, when the organic resin substrate 251 is disposed on a flat plane so that the device mounting surface faces toward an upward direction. As represented by a solid line in FIG. 16, when a composition composed of a core of a high melting point solder and a cladding of eutectic solder covering the core is employed for the solder ball 207, bending is considerably caused in the process for forming the underfill layer 209. In addition, when the solder ball 207 is composed of lead free solder, higher stiffness of the solder ball 207 is obtained, as represented by dotted line in FIG. 16, such that the organic resin substrate 251 is raised in the process for forming a junction with the semiconductor chip 205, causing a considerable bending.

As such, although the process for the generation of bending is different, depending on the material of the solder ball 207, it is difficult to inhibit the generation of bending in the organic resin substrate 251 in the thermal treatment process in the assembly of the conventional semiconductor device 200.

Consequently, the present inventors have eagerly conducted investigations for providing a better solution for inhibiting the bending after the assembly of the semiconductor device on the basis of the above-described scientific knowledge. As a result, it is found that the bending of the organic resin substrate in the package after the completion of the manufacture can be considerably reduced, by previously providing a convex curvature in the side of the back surface of device mounting surface in the organic resin substrate, on which a semiconductor chip is mounted, before mounting the chip thereon. Preferable embodiments according to the present invention will be described as follows in further detail, in reference to the annexed figures. In all figures, identical numeral is assigned to an element commonly appeared in the figures, and the detailed description thereof will not be presented. Although cases that a stiffener is joined onto an organic resin substrate will be described in the following exemplary implementations, a stiffener is not indispensable, and it is sufficient if a configuration including an interposer composed of an organic resin substrate is employed.

First Embodiment

Figure 1:
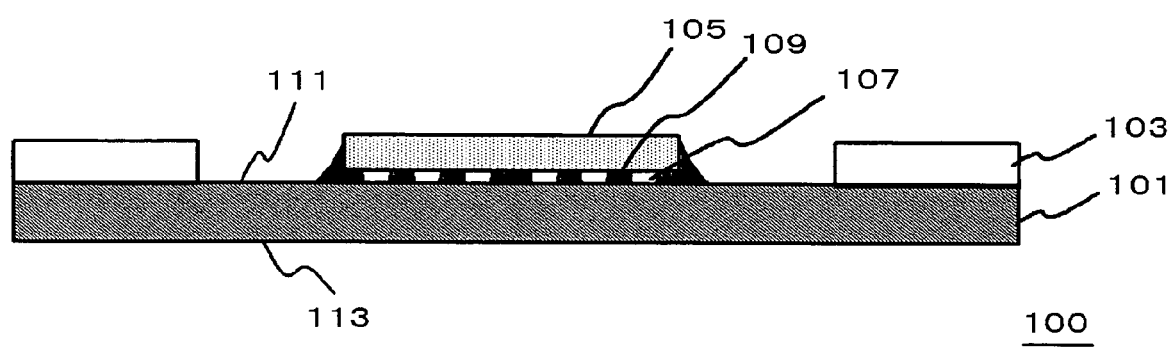
FIG. 1 is a cross-sectional view, illustrating a configuration of a semiconductor device in an embodiment of the present invention.
Figure 2:
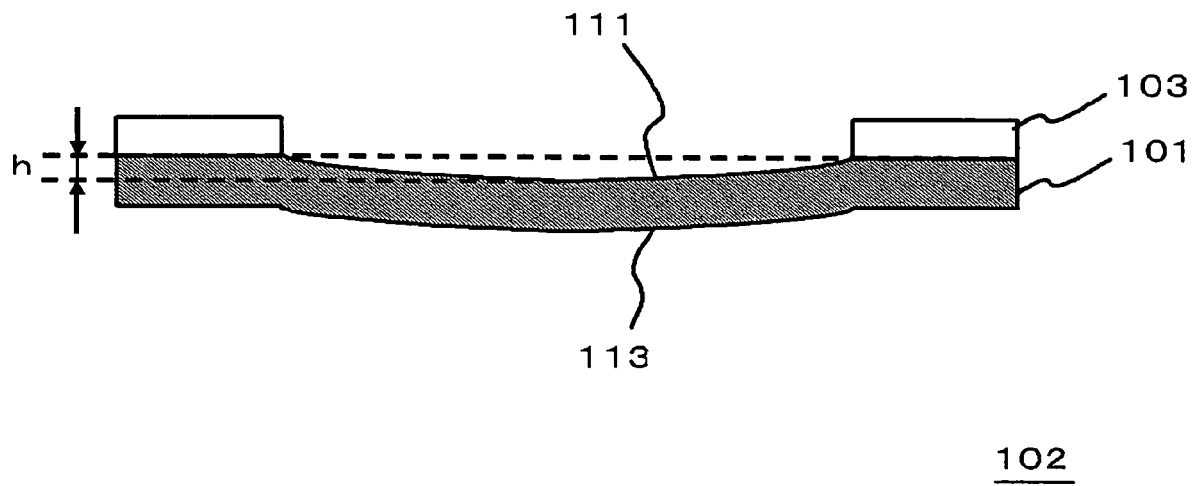
FIG. 2 is a cross-sectional view, illustrating a configuration of an interposer in the embodiment of the present invention.

FIG. 2 is a cross-sectional view, illustrating a configuration of an interposer of the present embodiment. FIG. 1 is a cross-sectional view, illustrating a configuration of a semiconductor device produced by employing the interposer shown in FIG. 2. The interposer shown in FIG. 2 is an interposer, which is composed of an organic resin substrate 101, and on one surface of which a semiconductor device (semiconductor chip 105 shown in FIG. 1) is mounted, and has a convex curvature in a side of a back surface 113 opposite to the device mounting surface 111. A height of a highest point of the device mounting surface 111 from a flat plane is, for example, 10 µm or more and 150 µm or less, when an organic resin substrate 101 of the interposer is disposed on the flat plane so that the back surface 113 faces toward an upward direction. In addition, a stiffener 103 that surrounds the device mounting region is joined to the device mounting surface of the organic resin substrate 101 to form a multiple-layered member 102.

The configuration of the multiple-layered member 102 will be described in more detail hereinafter. The multiple-layered member 102 is formed by disposing the stiffener 103 on the device mounting surface 111 of the organic resin substrate 101. The stiffener 103 is adhered to a periphery of the device mounting region of the organic resin substrate 101 through an adhesive layer (not shown). Here, the device mounting surface 111 is a surface, on which a semiconductor chip is mounted in a later process.

A dimension of the organic resin substrate 101 may be determined according to a dimension of a semiconductor chip to be mounted on the organic resin substrate 101, and may be a rectangular two-dimensional geometry having a dimension of, for example, on the order of 29 mm square to 50 mm square. Thickness of the organic resin substrate 101 may be, for example, equal to or larger than 0.3 mm, and preferably equal to or larger than 0.7 mm. Having such dimension, sufficient stiffness of the organic resin substrate 101 can be further assured. In addition, thickness of the organic resin substrate 101 may be, for example, equal to or lower than 1.8 mm, and preferably equal to or lower than 1 mm. Having such dimension, electrical characteristics of the interposer composed of the organic resin substrate 101 can be further improved.

In addition, the organic resin substrate 101 includes a convex curvature in the side of the back surface 113 opposite to the device mounting surface 111. A semiconductor chip is mounted on a valley portion of the device mounting surface 111. A level of the curvature h in the organic resin substrate 101 is represented by a difference in height between a horizontal plane and a highest point of the device mounting surface 111, when the organic resin substrate 101 is disposed on a horizontal plane so that the back surface 113 faces toward an upward direction. When the two-dimensional geometry of organic resin substrate 101 is a square or a rectangular, as in the present embodiment, the level of the curvature h can be obtained by measuring a height of the highest portion along a diagonal of the rectangle, for example. In addition, the level of the curvature h may be experimentally obtained, based on an amount of a convex bending generated in the side of the device mounting surface 111 in the process for manufacturing the semiconductor device 100 as discussed later. For example, the level of the curvature h may be equal to or larger than 10 µm, and preferably equal to or larger than 50 µm. Having such dimension, a generation of a bending in the semiconductor device 100, which is manufactured by employing the interposer 102 can be more surely inhibited. In addition, the level of the curvature h may be equal to or lower than 150 µm, and preferably equal to or lower than 100 µm. Having such dimension, a manufacturing stability for the semiconductor device 100 can be further improved.

A linear expansion coefficient along a direction normal to the organic resin substrate 101 (z direction) may be, for example, equal to or higher than 10 ppm/degree C., and preferably equal to or higher than 20 ppm/degree C. Having such configuration, the manufacturing stability in the heating process can be fully assured. In addition, a linear expansion coefficient in a direction normal to the organic resin substrate 101 (z direction) may be, for example, equal to or lower than 100 ppm/degree C., and preferably equal to or lower than 50 ppm/degree C. Having such configuration, difference in the thermal expansion coefficient between the substrate and the semiconductor chip 105 can be reduced, so that a bending of the substrate in the completion of the semiconductor device 100 can be more surely prevented.

In addition, an elastic modulus of the organic resin substrate 101 may be 15 GPa or more and 40 GPa or less. Having such configuration, further improved stability for manufacturing the semiconductor device 100 can be presented.

The organic resin substrate 101 has a dual-layered members, each of which is composed of a built-up (not shown) and a solder resist (not shown) disposed on the upper side of the built-up, and which are disposed on both sides of a core (not shown), respectively. The resin component of the core may be, for example, a bismaleimide-triazine resin (BT resin), an epoxy resin or the like. The base member of the core may be, for example, a glass. Further, the built-up includes, for example, an epoxy resin and a filler. Number of layers composed of the built-up that are adhered on each surface of the core may be suitably determined, depending on the design of the semiconductor device 100 employing the multiple-layered member 102. Further, for example, a photopolymer may be employed for the solder resist. More specifically, a photosensitive epoxy resin may be employed as the above-described photopolymer.

Material for composing the stiffener 103 may be, for example, copper or a copper-containing metal. Thickness of the stiffener 103 may be, for example, equal to or larger than 0.3 mm. Having such configuration, the bending of the organic resin substrate 101 occurred in the manufacture of the semiconductor device 100 employing the multiple-layered member 102 can be more effectively reduced. Further, the thickness of the stiffener 103 may be, for example, equal to or smaller than 1 mm, though it is influenced by the thickness of the mounted semiconductor chip 105. Having such dimension, the thickness of the multiple-layered member 102 can be further reduced. The thickness of stiffener 103 may more specifically be 0.66 mm.

Figure 3:
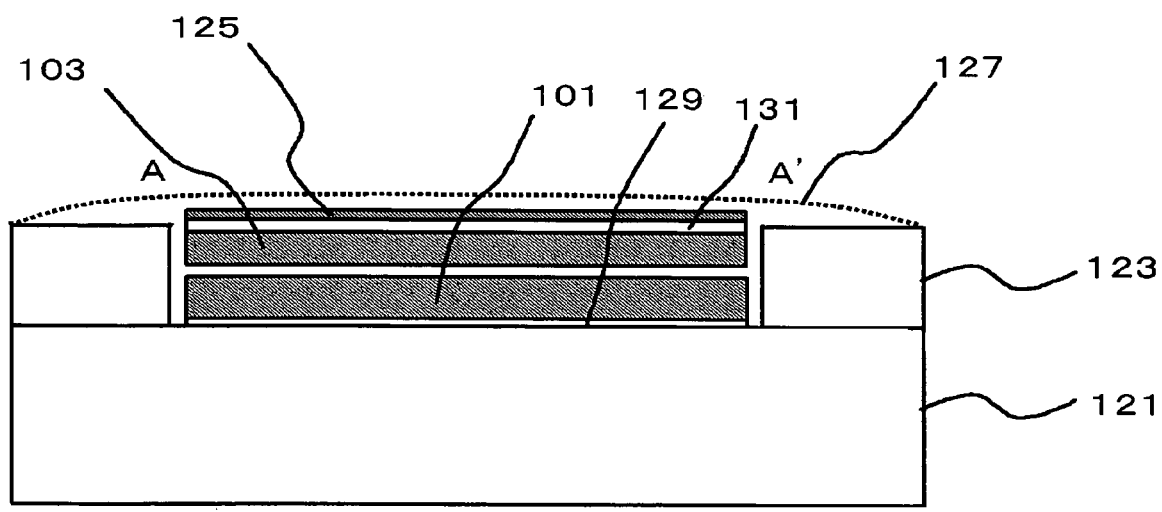
FIG. 3 is a cross-sectional view, illustrating a configuration of a jig for creating a curvature in the interposer.

Next, the method for manufacturing the multiple-layered member 102 will be described. The multiple-layered member 102 is obtained by, for example, stacking the organic resin substrate 101 and the stiffener 103 via an adhesive layer (not shown), and mounting to jig for forming a curvature, where these members are adhered. FIG. 3 is a cross-sectional view, illustrating a configuration of a jig for forming a curvature in the multiple-layered member 102 by bending thereof. The jig shown in FIG. 3 includes a frame jig 123 provided on a stainless steel (SUS) jig 121. In the inner region of the frame jig 123 on the SUS jig 121 is provided with a back surface side polyethylene terephthalate (PET) film 129, an organic resin substrate 101, an adhesive layer (not shown), a stiffener 103, a device mounting surface-side PET film 131, and an aluminum plate 125, which are disposed in this sequence from the bottom thereof, and the entire upper surfaces of the frame jig 123 and the aluminum plate 125 are covered with a lid 127. The lid 127 is employed to help maintaining an air-tightness of the region for disposing the organic resin substrate 101, and pressurizing the organic resin substrate 101 from a top surface (device mounting surface 111) toward a bottom surface (back surface 113).

Figure 4:
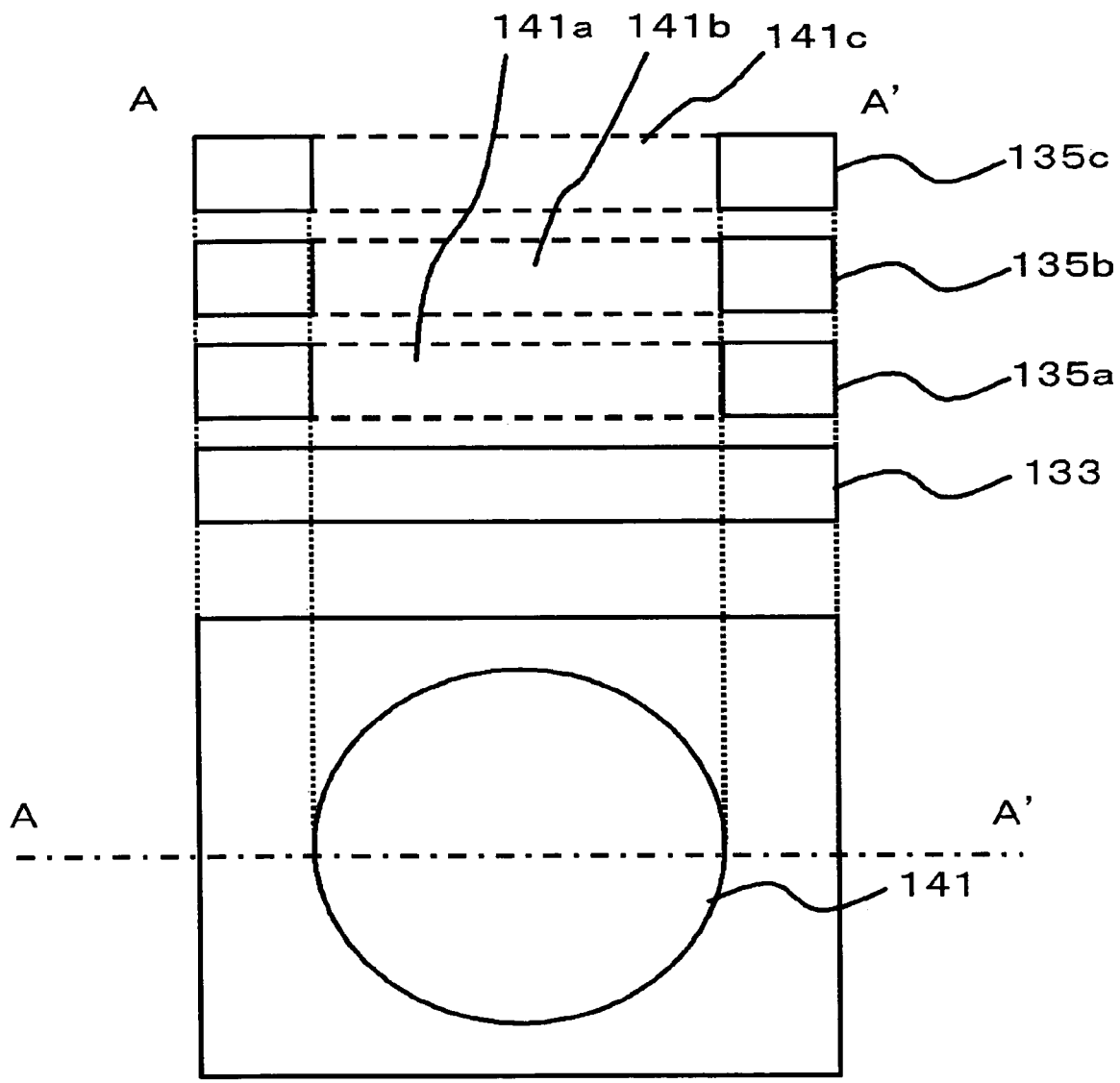
FIG. 4 is a schematic diagram, useful in describing the configuration of the jig for creating a curvature in the interposer.
Figure 5:
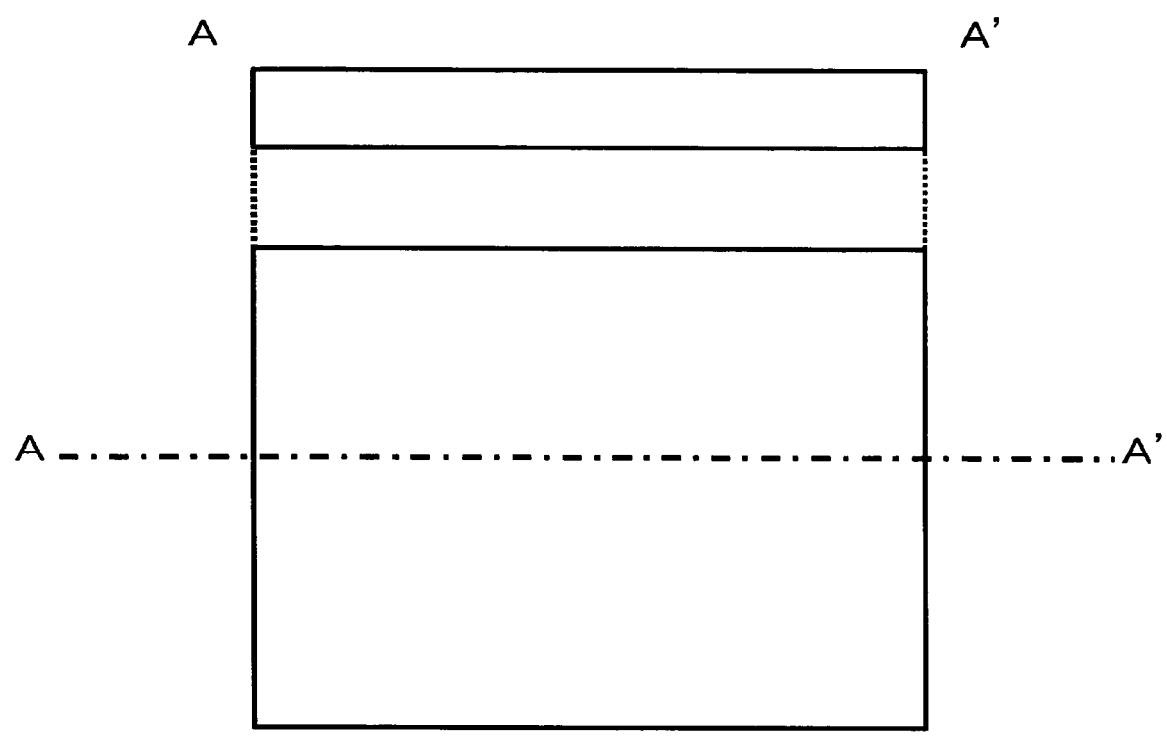
FIG. 5 is a schematic diagram, useful in describing the configuration of the jig for creating a curvature in the interposer.

FIG. 4 and FIG. 5 show configurations of the back surface-side PET film 129 of the jig for forming a curvature and the device mounting surface-side PET film 131, respectively. In each of FIG. 4 and FIG. 5, a diagram disposed below represents a plan view of the back surface-side PET film 129 and the device mounting surface-side PET film 131, and a diagram disposed above represents a cross-sectional view along line A-A' shown in the diagram disposed below.

As shown in FIG. 4, the back surface-side PET film 129 has a structure, which is formed by disposing a PET film 135a, a PET film 135b and a PET film 135c on a PET film 133 having no through hole. Since through holes 141a to 141c are provided in the centers of the PET films 135a to 135c, respectively, the back surface-side PET film 129 includes a concave portion 141 in the center. While the case that three pieces of PET films having through holes are disposed on the PET film 133 is illustrated in the present embodiment, suitable number of the PET films having through holes may be experimentally obtained based on the dimension of the curvature previously formed in the organic resin substrate 101. Different number of the PET films having through holes provides different levels of depth of the concave portion 141 provided in the back surface-side PET film 129, so that the level of the curvature in the organic resin substrate 101 can be adjusted.

Further, as shown in FIG. 5, the device mounting surface side PET film 131 is composed of a PET film having no concave portion.

In creating a curvature in the multiple-layered member 102, respective members are arranged as shown in FIG. 3, and, for example, the inside of the jig is evacuated while being heated, and thereafter, the reduced pressure created in the inside of the jig is released again to an atmospheric pressure, the releasing the vacuum being conducted from the side of the aluminum plate 125, so that the multiple-layered member 102 is pressed from the side of the top surface (device mounting surface 111). Then, since the concave portion 141 is formed in the back surface-side PET film 129, the organic resin substrate 101 is adhered to the stiffener 103, and a curvature is created in the organic resin substrate 101, depending on the depth of the concave portion 141, Next, the configuration of the semiconductor device employing the multiple-layered member 102 will be described. The semiconductor device 100 shown in FIG. 1 is formed by solder-joining the semiconductor chip 105 onto the device mounting surface 111 of the interposer that is composed of the organic resin substrate 101.

Further, in the semiconductor device 100, the semiconductor chip 105 is flip-chip bonded onto the device mounting surface 111 of the organic resin substrate 101 via the solder ball 107. An underfill resin layer 109 is formed between the semiconductor chip 105 and the organic resin substrate 101.

Next, the method for manufacturing the semiconductor device 100 will be described. FIG. 6A to FIG. 6C and FIG. 7A to FIG. 7C are cross-sectional views, illustrating a process for manufacturing the semiconductor device 100. The manufacturing process of the present embodiment includes the following process steps of, step 101: forming a concave surface on an organic resin substrate 101 by bending the organic resin substrate 101 so as to provide a concave curvature in a side of a device mounting surface 111 of the organic resin substrate 101 to provide a concave curvature; and step 103: joining a semiconductor chip 105 to the organic resin substrate 101 by disposing the semiconductor chip 105 on the concave surface and then heating thereof.

In the operation for joining the semiconductor chip 105 in step 103, the concave surface is stretched to provide a planarized surface.

Further, the method for manufacturing the semiconductor device 100 further includes, step 105: forming the underfill resin layer 109 between the semiconductor chip 105 and the organic resin substrate 101.

In the present embodiment, step 105 is conducted after the process operation of joining the semiconductor chip 105 in step 103. Then, in the process operation of joining the semiconductor chip 105 in step 103 and in the process operation of forming the underfill resin layer 109 in step 105, the concave surface is stretched to provide a flat surface. Further, the following step 107 may be included, step 107: previously acquiring a bending level of the substrate when the organic resin substrate 101 is thermally processed at a predetermined temperature, and the organic resin substrate 101 is bent in the aforementioned process operation of forming the concave surface in step 101, depending on said bending level acquired in step 107. Here, after the process operation of forming the underfill resin layer 109 in step 105, a process operation of providing a lid may be further included, and the bending of the substrate may be adjusted in consideration of the level of the bending occurred in the process operation of providing the lid.

The process operation of forming the concave surface in step 101 includes joining the stiffener 103 onto the device mounting surface 111 of the organic resin substrate 101 to form a multiple-layered member, and forming a concave surface in the multiple-layered member.

The process operation of joining the semiconductor chip 105 in step 103 includes joining the organic resin substrate 101 to the semiconductor chip 105 with lead free solder.

Figure 6A:
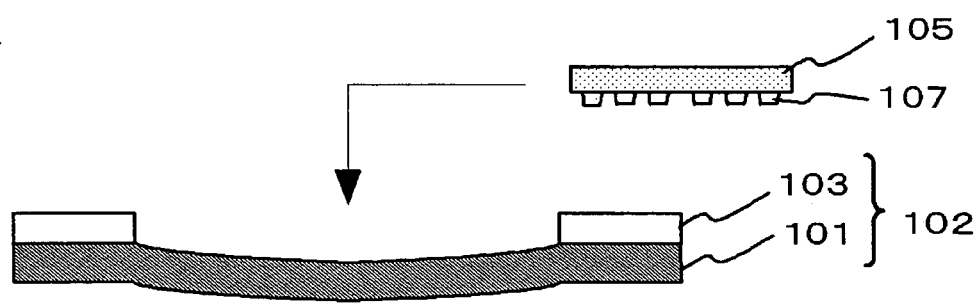
FIGS. 6A to 6C are cross-sectional views, illustrating a process for manufacturing the semiconductor device shown in FIG. 1.
Figure 6B:
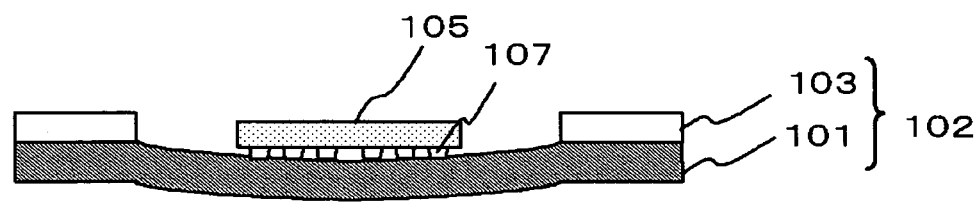

The process for manufacturing the semiconductor device 100 will be described in further detail below. First of all, as shown in FIG. 6A, the multiple-layered member 102 is prepared in the above-described procedure. In this case, the level of the bending, which is spontaneously created in the process for manufacturing the semiconductor device 100, is acquired in advance, and an inverted curvature for compensating the bending is previously provided to the multiple-layered member 102, based on the level of the spontaneous bending. Further, the semiconductor chip 105 having a predetermined device is prepared, and the solder ball 107 is joined to the device mounting surface of the semiconductor chip 105.

For example, a two-dimensional geometry of the organic resin substrate 101 is selected to be 50 mm square, and a two-dimensional geometry of the semiconductor chip 105 is selected to be 16.47 mm square. Further, the solder ball 107 is composed of, for example, lead free solder. More specifically, the component of the solder ball 107 contains tin, silver and copper. The elastic modulus of the solder ball 107 in this case is, for example, 41.6 GPa. Alternatively, the solder ball may be composed of only tin and silver. While the case of employing lead free solder for the solder ball 107 will be exemplified in the following description, eutectic solder may also alternatively be employed, in place of lead free solder. Elastic modulus of eutectic solder is, for example, 25.8 GPa. Further, the solder ball having eutectic solder, which is coated on the periphery of the core of high melting point solder may also alternatively be employed.

Figure 6C:
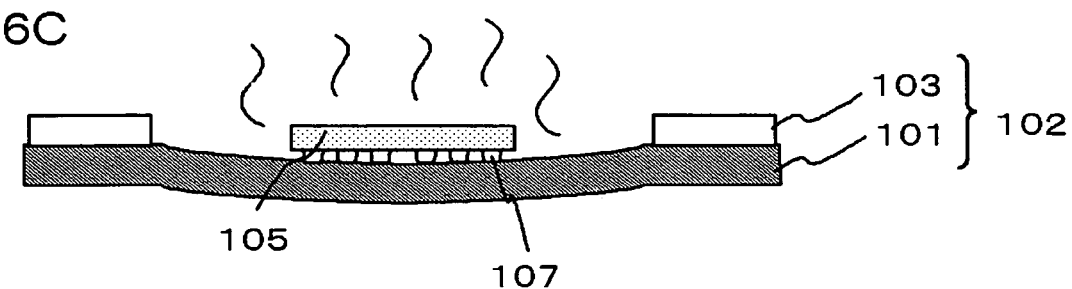
Figure 7A:
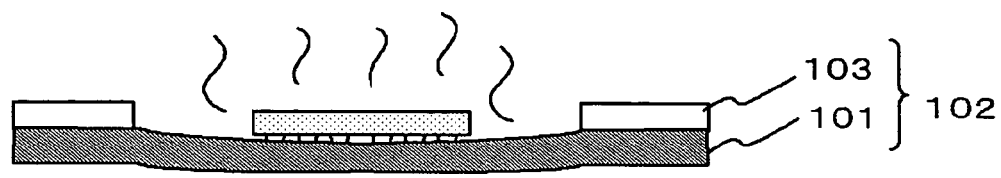
FIGS. 7A to 7C are cross-sectional views, illustrating a process for manufacturing the semiconductor device shown in FIG. 1.
Figure 7B:
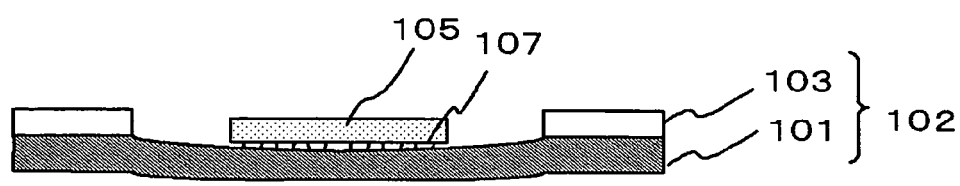
Figure 7C:
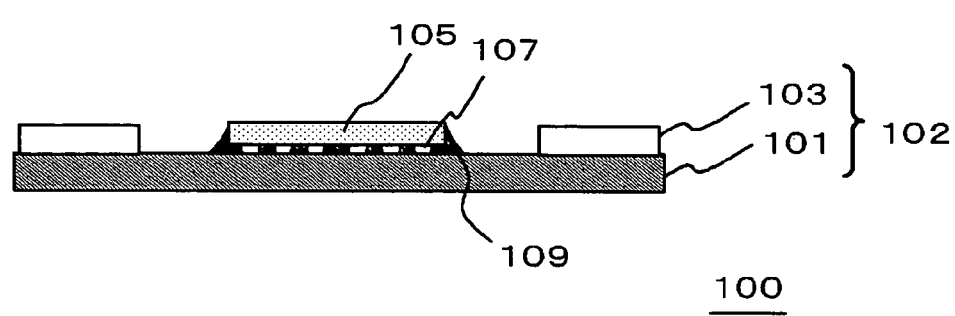

Next, the semiconductor chip 105 is installed on the device mounting surface 111 (FIG. 6B), and these members are heated to induce a reflow of solder ball 107, thereby joining thereof onto the organic resin substrate 101 (FIG. 6C). In this flip-chip bonding process, the interposer 102 is raised due to an internal stress generated when the solder ball 107 is cured again, a convex bending is generated in the side of the device mounting surface 111 of the organic resin substrate 101. The bending in this case has an inverted aspect from the aspect of the curvature that has been previously formed in the organic resin substrate 101, so that the bending spontaneously created in the interposer 102 is compensated to stretch thereof, providing the flat surface (FIG. 7A). Then, the multiple-layered member 102 having the semiconductor chip 105 mounted thereto is cooled down to an ambient temperature (FIG. 7B), and thereafter, a liquid underfill resin is supplied between the organic resin substrate 101 and the semiconductor chip 105, and then the resin is thermally cured to form the underfill resin layer 109 (FIG. 7C). In this way, the semiconductor device 100 shown in FIG. 1 is obtained.

In addition to above, when some bending is still remained in the organic resin substrate 101 even after the process operation shown in FIG. 7C, a lid (heat spreader), which is not shown here and covers the semiconductor chip 105 may be joined onto the stiffener 103. By providing the lid joined to the stiffener, the organic resin substrate 101 can be more surely stretched. The lid employing in this case may be composed of, for example, copper, aluminum, silicon, carbide or the like, and may have a thickness is around 0.5 to 1.5 mm.

Alternatively, the underfill resin layer 109 may be formed by employing a film-like resin in the process operation shown in FIG. 7C, in place of injecting the liquid underfill resin.

Next, advantageous effects obtainable by employing the configuration of the present embodiment will be described.

In the present embodiment, a concave curvature is provided to the organic resin substrate 101 in the side of the device mounting surface 111 in advance. This is configured to previously provide the curving substrate so as to have an inverted aspect from the bending that will be spontaneously generated in the assembly process. Such organic resin substrate 101 is employed to assemble the package of the semiconductor device 100, and the bending generated in the assembly process causes a stretching of the organic resin substrate 101 that is deliberately bent in advance. Consequently, even if a bending is generated in the interposer 102 to convexly warp the device mounting surface 111 by heating thereof in the process for assembling the semiconductor device 100, and more specifically in the process operation of joining the semiconductor chip 105 and the process operation of forming the underfill resin layer 109, the bending spontaneously generated in the manufacturing process can be compensated with the bending deliberately provided to the organic resin substrate 101. Thus, the semiconductor device 100 after the completion of the manufacture can be configured to exhibit better flatness of the surface of the organic resin substrate 101, as compared with the conventional device. Since the organic resin substrate 101 is provided with the planarized surface after the assembly process as described above, a planarization on the order of a level for fully satisfying the required co-planarity of, for example, not larger than 150 μm or not larger than 200 μm can be achieved, even in the case of employing no lid, thereby providing an improved production yield of the semiconductor device 100.

Further, the conventional interposer may exhibit more considerable bending when the semiconductor chip 105 is joined thereto, since the conventional interposer may have a convex bending in the side of the device mounting surface 111, contrary to the interposer of the present embodiment. On the contrary, since the inverted curvature, which has the inverted aspect from the aspect of the spontaneous bending generated in the operation of joining the semiconductor chip 105 thereto, is previously provided to the surface of the organic resin substrate 101 according to the present embodiment, a reverse bending generated in the process of mounting the semiconductor chip 105 can be utilized to planarize the organic resin substrate 101 at the stage of the completion of the assembly of the device.

Such advantageous effect can be considerably exhibited, when the lead free solder having relatively higher stiffness is employed as the solder ball 107. In addition, such advantageous effect can also be considerably exhibited in the case of the semiconductor device 100 that is employed without adhering the lid after the process operation described above in reference to FIG. 7C. In addition, such advantageous effect can also be considerably exhibited when the organic resin substrate 101 has a reduced thickness. Even if the interposer can not have sufficient stiffness for withstanding the stress due to the bending thereof generated in the manufacturing process, such as in the case that, for example, sufficient thickness of the interposer can not be assured for the reason of ensuring the necessary electrical characteristics, the configuration according to the present embodiment provides better flatness of the organic resin substrate 101 after the assembly of the semiconductor device 100, and therefore the requirement in the co-planarity can be satisfied.

Further, in the present embodiment, the curvature is formed by disposing the back surface-side PET film 129 on the bottom of the organic resin substrate 101 and pressurizing these members from the upward. Consequently, a level of the curvature h of the organic resin substrate 101 can be easily adjusted by suitably selecting the thickness and the number of the PET film 135a to the PET film 135c composing the back surface-side PET film 129.

Second Embodiment

While the curvature is formed by disposing the organic resin substrate 101 and the stiffener 103 between the PET films and evacuating and releasing the atmosphere in first embodiment, another procedure for creating a curvature may also be employed, in which an interposer and a stiffener may be aligned onto a jig having a concave portion corresponding to a level of the curvature h, and a punch having a convex portion that inversely follows the concave portion is lifted down from the upper direction to form a concave curvature in the side of the device mounting surface 111 while adhering the interposer with the stiffener. Descriptions of the exemplary implementation employing a metal mold will be made as follows.

Figure 8:
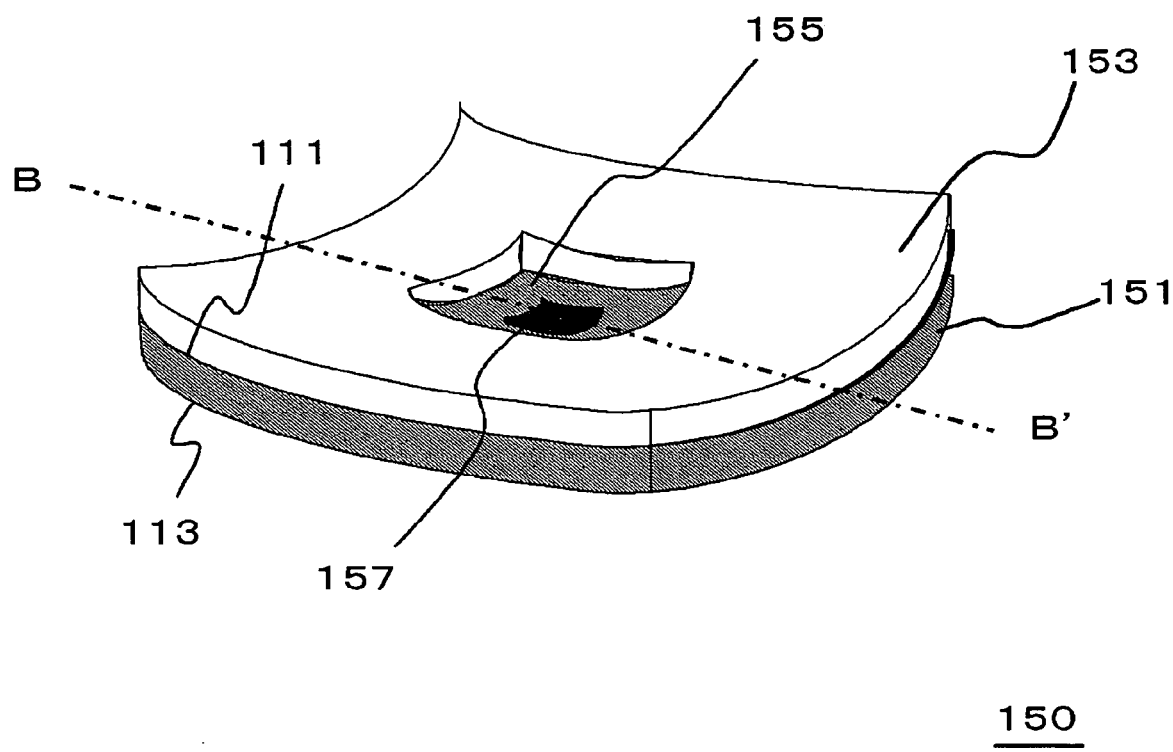
FIG. 8 is a perspective view, illustrating a configuration of an interposer in an embodiment of the present invention.
Figure 9:
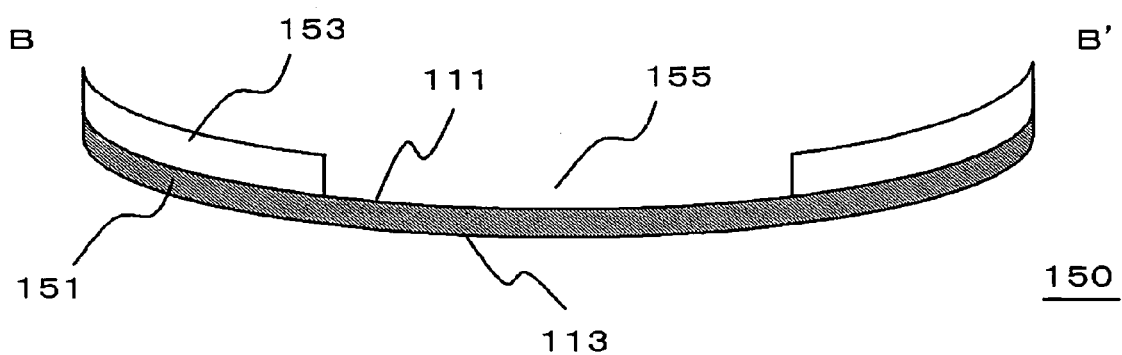
FIG. 9 is a cross-sectional view of the interposer shown in FIG. 9 along line B-B'.

FIG. 8 is a perspective view, illustrating a configuration of an interposer of the present embodiment, and FIG. 9 is a cross-sectional view along line B-B' shown in FIG. 8. A multiple-layered member 150 that shown in FIG. 8 and FIG. 9 includes an interposer composed of an organic resin substrate 151 and a stiffener 153, which are mutually joined via an adhesive layer (not shown). An opening 155 is provided in the center of the stiffener 153, and a device mounting region 157 of the organic resin substrate 151 is exposed from the opening 155.

Materials, dimensions and thickness of the organic resin substrate 151 and the stiffener 153 may be selected to be similar as that of, for example, the organic resin substrate 101 and the stiffener 103 described in first embodiment.

The multiple-layered member 150 also has a convex curvature in the side of the back surface. 113 opposite to the device mounting surface 111 of the organic resin substrate 151. In addition to above, while the multiple-layered member 102 shown in FIG. 2 has the curvature in the device mounting region of the organic resin substrate 101 and a peripheral thereof, the multiple-layered member 150 of the present embodiment has a continuous curvature on the entire surfaces of the organic resin substrate 151 and the stiffener 153.

Figure 10:
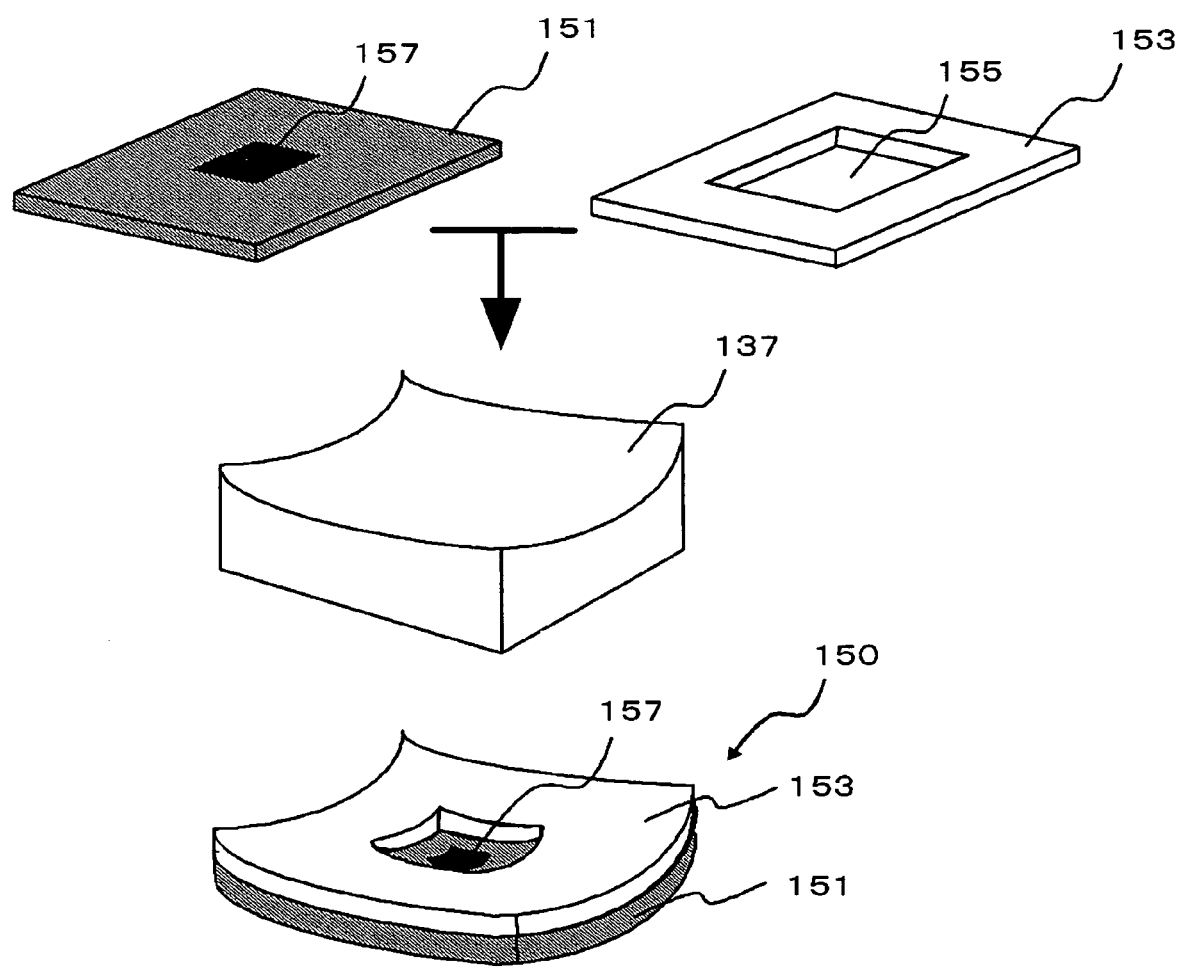
FIG. 10 includes exploded perspective views, useful in describing a method for manufacturing the interposer shown in FIG. 8.
Figure 11:
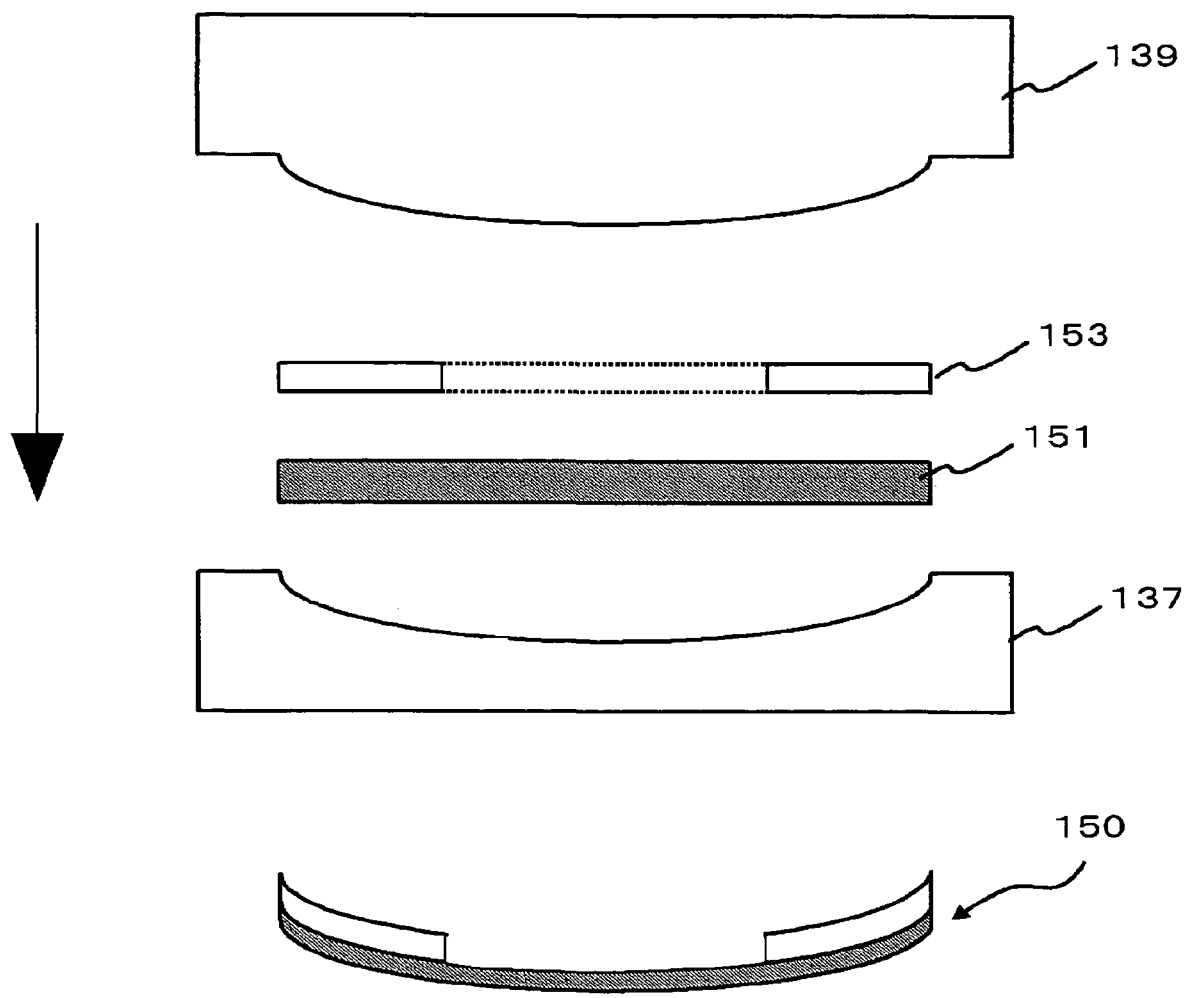
FIG. 11 includes cross-sectional views, useful in describing a process for manufacturing the interposer shown in FIG. 8.

Next, the method for manufacturing the interposer of the present embodiment will be described. FIG. 10 and FIG. 11 are a perspective view and a cross-sectional view, respectively, which are useful in describing the method for manufacturing the multiple-layered member 150. In the manufacturing process for the present embodiment, the process operation for forming the concave surface in step 101 includes, step 109: preparing a first jig having a concave portion that follows the geometry of the concave surface (concave metal mold 137) and a second jig having a convex portion that inversely follows the geometry the concave portion (convex metal mold 139); and step 111: disposing the organic resin substrate 151 is arranged between the concave metal mold 137 and the convex metal mold 139, and the concave metal mold 137 and the convex metal mold 139 are pressed against the organic resin substrate 151 to form a concave surface.

More specifically, as shown in FIG. 10 and FIG. 11, first of all, the concave metal mold 137 and the convex metal mold 139 having the convex portion that inversely follows the geometry of the concave portion of the concave metal mold 137 are prepared in the present embodiment. The concave portion of the concave metal mold 137 has a geometry that corresponds to the level of the curvature h in the organic resin substrate 151.

The multiple-layered member 150 is formed by disposing the organic resin substrate 151, an adhesive layer (not shown) and the stiffener 153 on the concave metal mold 137 in this sequence, disposing the convex metal mold 139 on the stiffener 153, and pressing the convex metal mold 139 from the upward toward the downward.

In the present embodiment, the organic resin substrate 151 composing the multiple-layered member 150 has a convex curvature in the side of the back surface 113, and therefore the substrate is configured to have an inverse curvature previously formed therein from the bending to be created in the interposer 150 during the process for mounting the semiconductor chip. Consequently, advantageous effects obtainable by employing the configuration of first embodiment can also be obtained.

While the preferred embodiments of the present invention have been described above in reference to the annexed figures, it should be understood that the disclosures above are presented for the purpose of illustrating the present invention, and various configurations other than the above described configurations can also be adopted.

While the above-described embodiments illustrates, for example, the case of disposing the stiffener on the organic resin substrate, and joining and curving these members, the stiffener is not necessarily provided in the above-described embodiments, and in such case, the organic resin substrate can also be previously curved by employing the process described above employing only the organic resin substrate.

EXAMPLES

Example 1

A semiconductor package (FIG. 1 and FIG. 2) was manufactured employing the process described in first embodiment. Materials of each of the layers in the organic resin substrate 101 were, core: BT resin;

built-up: metallic copper (Cu), four layers for each faces; and solder resist: photosensitive epoxy resin.

Further, a Cu plate having a thickness of 0.66 mm and having an opening formed therein was employed for the stiffener 103.

Further, the dimension of the organic resin substrate 101 was 50 mm square, and the dimension of the semiconductor chip 105 was 16.47 mm square. In addition, the thickness of the organic resin substrate 101 was 1.08 mm.

The multiple-layered member 102 was manufactured by employing the jig shown in FIG. 3. Thickness of the device mounting surface-side PET film 131, the PET film 133 and the PET film 135*a* to the PET film 135*c* were selected to be all 25 µm, and a weighting of about 120 Ns was applied thereto along a direction from the stiffener 103 to the organic resin substrate 101 at 150 degree C. for two hours to adhere the organic resin substrate 101 with the stiffener 103. In addition to above, suitable magnitude of the weighting was determined to be around a value obtained by multiplying the adhesive area of the stiffener 16.7 $cm^2$ by a required weighting 7 $N/cm^2$ that is required for exhibiting a predetermined adhesive force by the adhesive agent.

In the obtained multiple-layered member 102, the level of the curvature h of the organic resin substrate 101 was around 30 to 50 µm. The obtained multiple-layered member 102 was employed to manufacture the semiconductor device 100 via the procedure described above in reference to FIG. 6A to FIG. 6C and FIG. 7A to FIG. 7C. Lead free solder containing tin, silver and copper was employed for the solder ball 107.

Example 2

Similar procedure as employed in example 1 was also conducted, except that a PET film 133 having no through hole 141*a* to through hole 141*c* was employed, in place of employing the PET film 135*a* to the PET film 135*c*. That is, four pieces of PET films 133 were employed in an overlapped manner to form the back surface-side PET film 129. Then, a multiple-layered member was manufactured using the procedure employed in example 1.

Then, the obtained multiple-layered member was employed to manufacture the semiconductor device using the procedure employed in example 1.

(Evaluations)

Figure 12:
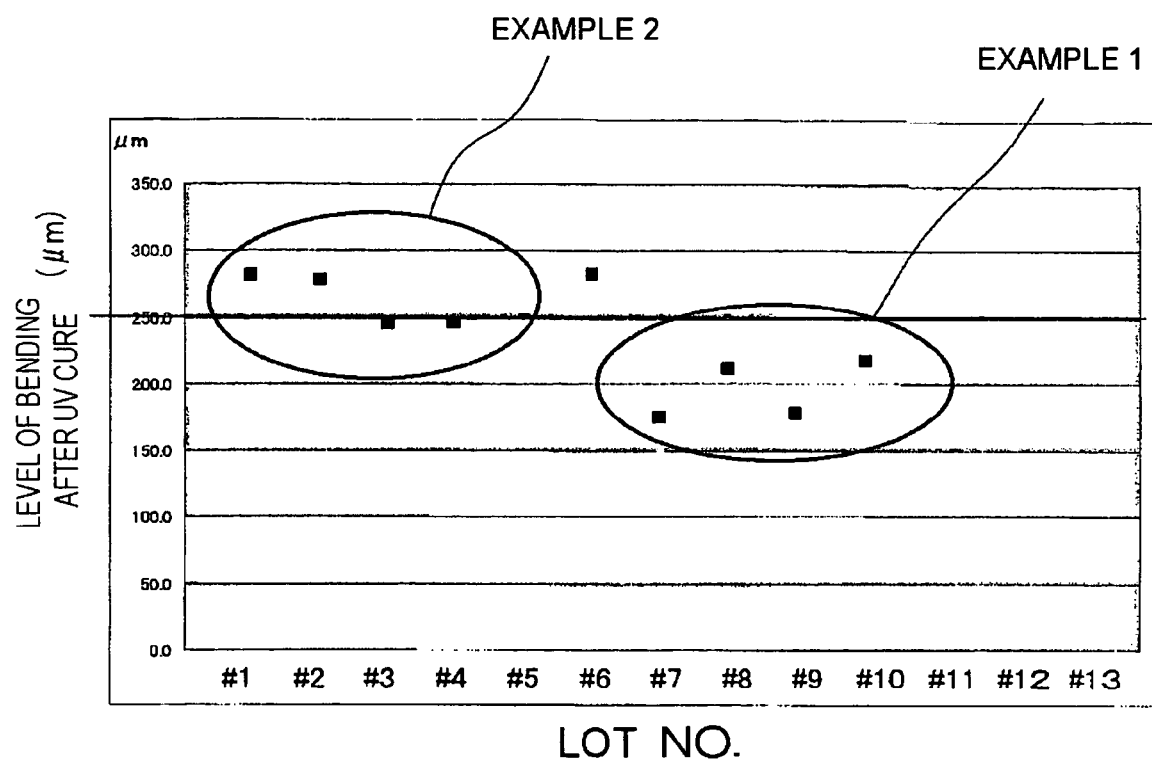
FIG. 12 is a graph, showing level of bending of the substrate generated in the process for manufacturing semiconductor devices in an example.

For the semiconductor devices manufactured in example 1 and example 2, a level of a bending generated in the side of the device mounting surface of the organic resin substrate after the assembly, or more specifically after forming the underfill resin layer was measured. The obtained semiconductor device was disposed on a flat plane so that the device mounting surface of the organic resin substrate faces toward an upward direction, and a height from the flat plane to a highest point of the organic resin substrate was measured by employing an ultrasonic wave measuring device. FIG. 12 is a graph, showing a level of bending (µm) generated in the organic resin substrate of the obtained semiconductor device in example 1 (lot #7 to #10) and example 2 (lot #1 to #4).

As can be seen from FIG. 12, in example 1 as compared with example 2, it was found that the level of the bending generated in the organic resin substrate 101 in semiconductor device 100 after the assembly was inhibited so as to satisfy the required co-planarity, by previously forming a concave curvature in the side of the device mounting surface 111 in the organic resin substrate 101.

In addition to above, when a lid was further adhered to the semiconductor device 100 obtained in example 1, it was confirmed that the level of the bending generated in the organic resin substrate 101 could be further reduced by about 50 µm.

It is apparent that the present invention is not limited to the above embodiment, that may be modified and changed without departing from the scope and spirit of the invention.

What is claimed is:

1. A method for manufacturing a semiconductor device, comprising:

forming a concave surface on an organic resin substrate by bending the organic resin substrate so as to provide a concave curvature in a side of a device mounting surface of the organic resin substrate; and wherein said forming the concave surface includes joining a stiffener onto a device mounting surface of said organic resin substrate to form a multiple-layered member, and forming said concave surface in said multiple-layered member joining a semiconductor device to said organic resin substrate by disposing said semiconductor device on said concave surface and then heating thereof;

wherein, in said joining the semiconductor device, said concave surface is stretched to provide a planarized surface.

2. The method for manufacturing the semiconductor device according to claim 1, further comprising forming an underfill layer between said semiconductor device and said organic resin substrate, wherein, in said joining the semiconductor device and in said forming the underfill layer, said concave surface is stretched to provide a planarized surface.

3. The method for manufacturing the semiconductor device according to claim 1, further comprising previously acquiring a bending level for bending the substrate when said organic resin substrate is thermally processed at a predetermined temperature, wherein said organic resin substrate is bent depending on said bending level occurred in said forming the concave surface.

4. The method for manufacturing the semiconductor device according to claim 1, wherein said forming the concave surface includes:

preparing a first jig comprising a concave portion corresponding to a geometry of said concave surface and a second jig comprising a convex portion corresponding to a geometry of said concave portion; and disposing said organic resin substrate between said first jig and said second jig and pressing said first jig and said second jig against said organic resin substrate to form said concave surface.

5. The method for manufacturing the semiconductor device according to claim 1, wherein said joining the semiconductor device includes joining said organic resin substrate to said semiconductor device with lead free solder.

* * * * *